United States Patent
Walsh

(10) Patent No.: US 7,466,128 B2
(45) Date of Patent: Dec. 16, 2008

(54) MULTICOIL NMR DATA ACQUISITION AND PROCESSING METHODS

(75) Inventor: David O. Walsh, Mukilteo, WA (US)

(73) Assignee: Vista Clara, Inc., Everett, WA (US)

( * ) Notice: Subject to any disclaimer, the term of this patent is extended or adjusted under 35 U.S.C. 154(b) by 136 days.

(21) Appl. No.: 11/329,313

(22) Filed: Jan. 9, 2006

(65) Prior Publication Data

US 2006/0186882 A1    Aug. 24, 2006

Related U.S. Application Data

(63) Continuation-in-part of application No. PCT/US2004/021911, filed on Jul. 9, 2004.

(60) Provisional application No. 60/485,689, filed on Jul. 9, 2003.

(51) Int. Cl.
*G01V 3/00*    (2006.01)

(52) U.S. Cl. ........................... 324/309; 324/307

(58) Field of Classification Search ......... 324/300–322; 600/410, 420, 422
See application file for complete search history.

(56) References Cited

U.S. PATENT DOCUMENTS

| | | | |
|---|---|---|---|
| 3,019,383 A | | 1/1962 | Varian |
| 4,812,760 A | * | 3/1989 | Bottomley et al. ........... 324/309 |
| 5,545,995 A | * | 8/1996 | Schneider et al. ........... 324/318 |
| 5,759,152 A | | 6/1998 | Felmlee et al. |
| 6,107,797 A | | 8/2000 | Sezginer |
| 6,160,398 A | | 12/2000 | Walsh |
| 6,366,086 B1 | | 4/2002 | Sen |
| 6,477,398 B1 | * | 11/2002 | Mills ........................... 600/409 |
| 6,593,740 B1 | * | 7/2003 | Van Den Brink et al. .... 324/307 |
| 7,035,682 B2 | * | 4/2006 | Van Den Brink et al. .... 600/420 |
| 2003/0122545 A1 | * | 7/2003 | Van Den Brink et al. .... 324/309 |
| 2006/0186882 A1 | * | 8/2006 | Walsh ........................ 324/309 |

FOREIGN PATENT DOCUMENTS

EP    0170508 A    2/1986

OTHER PUBLICATIONS

Article by C.E. Hayes, et al., entitled "Volume Imaging with MR Phased Arrays", published in Magnetic Resonance in Medicine, vol. 18, dated Apr. 1, 1991, pp. 309-319.

International Search Report dated Jan. 14, 2005 re PCT Application No. PCT/US2004/021911, Applicant, David O. Walsh.

(Continued)

*Primary Examiner*—Brij Shrivastav
*Assistant Examiner*—Tiffany A Fetzner
(74) *Attorney, Agent, or Firm*—Holland & Hart LLP

(57) ABSTRACT

A multicoil NMR data acquisition apparatus and processing method for performing three-dimensional magnetic resonance imaging in a static magnetic field without the application of controlled static magnetic field gradients. A preferred application relates specifically to the detection and localization of groundwater using the Earth's magnetic field. Multicoil arrays are used in both transmit and receive modes, and coherent data processing algorithms applied to the data to generate three-dimensional NMR spin density estimates. Disclosed are methods for acquiring NMR data using an array of at least two transmit and receive coils, and for processing such multicoil data to estimate the three-dimensional NMR spin density distributions.

18 Claims, 2 Drawing Sheets

OTHER PUBLICATIONS

Article by Anatoly Legchenko, entitled "A Revised Mathematical Model of Magnetic Resonance Sounding", presented at the MRS-2nd International Workshop, Nov. 19-21, 2003 in Orleans, France.

Article by Marian Hertrich & Ugur Yaramanci, entitled "Surface-NMR with Separated Loops-Investigations on Spatial Resolution", presented at the MRS-2nd International Workshop, Nov. 19-21, 2003 in Orleans, France.

Article by Warsa Warsa et al., entitled "3-D Modelling and Assessment of 2-D inversion of Surface NMR", presented at the MRS-2nd International Workshop, Nov. 19-21, 2003 in Orleans, France.

Article by Anatoly Legchenko, entitled "Industrial Noise and Processing of the Magnetic Resonance Signal", presented at the MRS-2nd International Workshop, Nov. 19-21, 2003 in Orleans, France.

* cited by examiner

MULTICOIL NMR DATA ACQUISITION AND PROCESSING METHODS

This application is a continuation-in-part of International Application No. PCT/US2004/021911, filed Jul. 9, 2004, which designates the United States, and which claims the benefit of to provisional application No. 60/485,689, filed on Jul. 9, 2003.

BACKGROUND OF THE INVENTION

Multicoil MRI has been used for many years to non-invasively examine the nuclear magnetic resonance (NMR) spin density distribution within three dimensional objects or volumes. Typically, using existing MRI data acquisition methods and data processing methods, the object under investigation is placed in a static magnetic field $B0$ and is energized by an alternating magnetic field $B1$. The frequency of the alternating magnetic field $B1$ is selected as the Larmor frequency (the natural nuclear magnetic resonant frequency) for the atomic species of interest. The Larmor frequency depends upon the magnitude of the static field $B0$, among other factors. A number of well-known MRI applications have detected the hydrogen proton spin density, although it is possible to image carbon, potassium and other atomic species with certain nuclear spin properties.

Typically, using existing MRI data acquisition methods and data processing methods, magnetic field gradients are applied across the object under investigation, either during or after the application of the alternating field $B1$. These magnetic field gradients cause the frequency of the NMR signal to vary in a predictable way along the various spatial dimensions of the object under investigation. Thus, in the prior state of the art of MRI, spatial localization is accomplished by frequency and/or phase encoding of the object through the application of controlled magnetic field gradients.

Some existing MRI devices are designed to use multiple coils during data acquisition, and some conventional MRI data processing methods exploit the differences between the individual coil fields to enhance the spatial resolution and quality of the NMR image. See for example U.S. Pat. No. 6,160,398. However, all existing MRI devices, MRI data acquisition methods and MRI data processing methods derive some or all of the spatial information required for imaging in three dimensions through the application of magnetic gradient fields.

While existing MRI devices, data acquisition methods and data processing methods may be suitable for the particular purpose to which they address, they are not as suitable for performing three dimensional magnetic resonance imaging in a static magnetic field without the application of controlled static magnetic field gradients.

A primary limitation of existing MRI devices and methods is the requirement to generate and control gradients in the static field $B0$. The generation and control of such gradients requires specially designed gradient field coils, and these coils are typically only effective when employed in certain constrained geometries. For example, in medical MRI, a great deal of research has been undertaken to design and construct the gradient coils for specific MRI scanner designs, and the gradient coil assemblies represent a significant portion of the scanner's expense. Most conventional MRI scanners use gradient coils that surround the object under investigation in order to produce approximately linear field gradients.

For many potential applications of three-dimensional MRI, the requirement to generate and control static field gradients is either impractical or prohibitively expensive. For example, in the investigation of subsurface groundwater distributions via surface coil NMR measurements, the generation of significant gradients in the Earth's magnetic field at operationally significant depths would require large amounts of power and complex arrays of magnetic field antennae. The imaging of other large fixed objects, such as bridge supports and building foundations, is similarly constrained by power requirements and the difficulty in generating and controlling static field gradients in three dimensions. Other potential applications of MRI, such as industrial non-destructive evaluation of raw materials, are not presently commercially viable due to the expense and geometrical constraints associated with conventional gradient-based MRI scanners.

Surface NMR data acquisition methods and data processing methods have been used for many years to detect and localize subsurface groundwater. The existing state of the art in surface NMR utilizes a single surface coil to generate the alternating $B1$ field. The $B1$ field is transmitted with various levels of energy, and the measured NMR signals received on the same coil or a single separate coil are mathematically processed to estimate a profile for the groundwater distribution in one dimension only: depth. While existing surface NMR devices, data acquisition methods and data processing methods may be suitable for the particular purpose to which they address, they are not as suitable for performing three dimensional magnetic resonance imaging in a static magnetic field without the application of controlled static magnetic field gradients. Many surface NMR techniques can produce, at best, an estimate of the 1-dimensional groundwater density profile directly beneath the coil. These 1-D profile estimates are subject to a variety of errors stemming from the use of a single surface coil, and inaccurate 1-D models of the coil fields and water density profiles.

In recent years, single-coil surface NMR instruments have been developed and commercialized, and surface NMR data processing methods have been developed to characterize the distribution of groundwater in one or two dimensions. The first working surface NMR instrument was developed in the U.S.S.R. as described by Semenov et al. in USSR inventor's certificate 1,079,063, issued in 1988. The existing state of the art in surface NMR, epitomized by the commercial "Numis" brand instrument, utilizes a single surface coil to generate the alternating $B1$ field. The $B1$ field is transmitted with various levels of energy, and the measured NMR signals received on the same surface coil or a single separate surface coil are mathematically processed to estimate a profile for the groundwater distribution in one dimension only: depth. A commonly employed one-dimensional surface NMR profiling is described by Legchenko and Shushakov in "Inversion of surface NMR data" appearing in Geophysics vol. 63: 75-84 (1998), incorporated hereinto by reference.

Presently available 1-D profile estimation techniques, which are based on single coil surface NMR systems, rely on a single measurement variable: the transmitted pulse energy and its relation to tip angle, to estimate a water density profile in depth. The NMR signal amplitude at a given point in space is a sinusoidal function of the flip angle at that location. Present 1-D inversion techniques measure the NMR signal using different transmit pulse energy levels, and then fit the set of NMR amplitudes to a simplified 1-D model. To make the inversion tractable, the coil vector field lines are assumed to be parallel and confined to a cylinder directly beneath the coil, and the water density profile is assumed to vary in one dimension only.

Reliance on one dimensional modeling according to the prior art therefore engenders certain deficiencies. A first fundamental problem is that the coil field lines are very different from the assumed cylindrical model over large portions of the investigation space. The generated signal depends upon the angle between the earth's vector field and the coil's vector field. A second fundamental problem is the assumption that the water density profile varies in one dimension only. Three-dimensionally variant aquifers, which are common in nature, cannot be adequately characterized using simple 1-D models. A third fundamental problem is that even if accurate coil field models were employed and 3-D water distributions were allowed, the resulting inversion would suffer from ambiguities. The integrated NMR signal depends on the 3-D distribution of water, the coil field lines, the Earth's field direction, and the transmitted pulse energy. Varying the pulse energy alone does not provide enough information to unambiguously solve the 3-D inversion problem.

In recognition of the limitations, ambiguities and potential errors imposed by the use of a single surface coil, other researchers have investigated the possibility of multi-dimensional surface NMR investigation using one or more laterally displaced surface coils. Hertrich and Yaramanci presented a three dimensional mathematical kernal function for the surface NMR signal source in "Surface-NMR with spatially separated loops—investigations on spatial resolution" appearing in the 2nd International Workshop on the Magnetic Resonance Sounding method applied to non-invasive groundwater investigations (19-21 Nov. 2003), incorporated herein by reference. Warsa, Mohnke and Yaramanci presented a discrete approximation of a 3-D model for the surface NMR signal source in "3-D modeling and assessment of 2-D inversion of surface NMR" appearing in the 2nd International Workshop on the Magnetic Resonance Sounding method applied to non-invasive groundwater investigations (19-21 Nov. 2003), also incorporated herein by reference. Although these references are useful in the development of the present invention, they do not describe a practical method for processing multi-coil surface NMR data into useful multi-dimensional estimates of the subsurface liquid distributions, and these references explicitly acknowledge the absence of such a method.

It is also recognized that electromagnetic field noise places another limitation on the utility and reliability of the prior state of the art in surface NMR. A variety of noise processes limit the ability to detect and localize groundwater using surface NMR measurements. Prior attempts to mitigate such noise have been limited to temporal processing of the raw data from a single coil. The existing prior art in this area is described by Legchenko in "Industrial noise and processing of the magnetic resonance signal" appearing in the 2nd International Workshop on the Magnetic Resonance Sounding method applied to non-invasive groundwater investigations (19-21 Nov. 2003), incorporated herein by reference. Temporal processing methods, such as narrowband filtering of the surface NMR signal, may distort the NMR signal itself and are ineffective when the frequency band of the noise process coincides with the desired surface NMR signal.

SUMMARY OF THE INVENTION

In view of the foregoing deficiencies inherent in the known types of multicoil NMR data acquisition methods and data processing methods now present in the prior art, the present invention provides new multicoil NMR data acquisition and processing methods wherein the same can be utilized for performing three dimensional magnetic resonance imaging in a static magnetic field without the application of controlled static magnetic field gradients.

The general purpose of the present invention, which will be described subsequently in greater detail, is to provide a new multicoil NMR data acquisition and processing method that has many of the advantages of the multicoil NMR data acquisition methods and data processing methods mentioned heretofore and many novel features that result in a new multicoil NMR data acquisition and processing method which is not anticipated, rendered obvious, suggested, or implied by any of the prior art multicoil NMR data acquisition methods and data processing methods, either alone or in any combination thereof.

To attain this, an embodiment of the present invention generally comprises a method for acquiring NMR data using an array of two or more transmit coils and two or more receive coils, and a method for processing such multicoil data to estimate the three-dimensional NMR spin density distribution within the object or volume under investigation. Features of the embodiment include a multicoil NMR data acquisition method, which utilizes multiple coil arrays in both transmit mode and receive mode, and which does not involve the generation or control of gradients in the static magnetic field; an imaging method for processing the data acquired via the multicoil surface NMR data acquisition method, which yields a three-dimensional estimate of the NMR spin density distribution; a noise cancellation method for processing the data acquired by the multi-coil surface NMR data acquisition method, which reduces undesired noise in the raw data and in the resulting three-dimensional estimate of the NMR spin density distribution.

The multicoil NMR data acquisition method uses an array of at least two transmit coils, and at least two receive coils. A single multi-coil FID measurement is recorded by driving the transmit coils with a current pulse at the Larmor frequency of the target, and after a short delay, recording the resulting NMR free induction decay signal for each of the receive coils. A series of independent measurements are obtained by using unique combinations of relative amplitudes and/or phases on the transmit coils, and unique total transmitted energy levels. The use of multi-coil arrays in both the transmit and receive modes introduces a unique dependence between the acquired set of signals generated by an isolated point source in space and the vector fields of the various coils relative to that point in space. The variance among the vector coil fields over the three-dimensional imaging volume makes it possible to isolate and locate signal sources in three dimensions.

The imaging method embodiment comprises specific data processing methods for processing NMR data acquired via the multicoil NMR data acquisition arrangement: a matched filtering data processing method, an adaptive filtering data processing method, and a linear inverse/least-squares data processing method. These data processing methods yield three-dimensional estimates of the NMR spin density distribution of the target. The data processing methods also yield estimates of the time-domain NMR signal processes emanating from discrete locations in the volume. These time-domain signal estimates can be further processed using previously developed analysis techniques to yield additional information on the physical properties of the materials under investigation.

The noise cancellation method embodiment comprises specific data processing methods for processing surface NMR data acquired via the multicoil surface NMR data acquisition arrangement: a noise cancellation data acquisition method which utilizes one or more reference measurements to estimate the unwanted noise process, and a noise cancellation data processing method which adaptively estimates and subtracts the noise process from surface NMR data.

The invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

BRIEF DESCRIPTION OF THE DRAWINGS

Various other objects, features and attendant advantages of the present invention will become fully appreciated as the same becomes better understood when considered in conjunction with the accompanying drawings, in which like reference characters designate the same or similar parts throughout the several views, and wherein.

DETAILED DESCRIPTION OF THE INVENTION

Multicoil NMR Data Acquisition Procedure

An array of at least two transmit coils and at least two receive coils are arranged in the vicinity of the object or volume to be investigated. A single NMR measurement is performed by driving one or more of the transmit coils with an alternating current at the Larmor (resonant) frequency of the target, e.g., water, and then recording the resulting NMR signal from the at least two receive coils. A series of such NMR measurements are performed using at least two linearly independent combinations of relative current amplitudes and/or phases among the transmit coils (henceforth referred to as the transmit array combination), and using at least two values of total transmitted energy for each transmit array combination.

Figure 1:
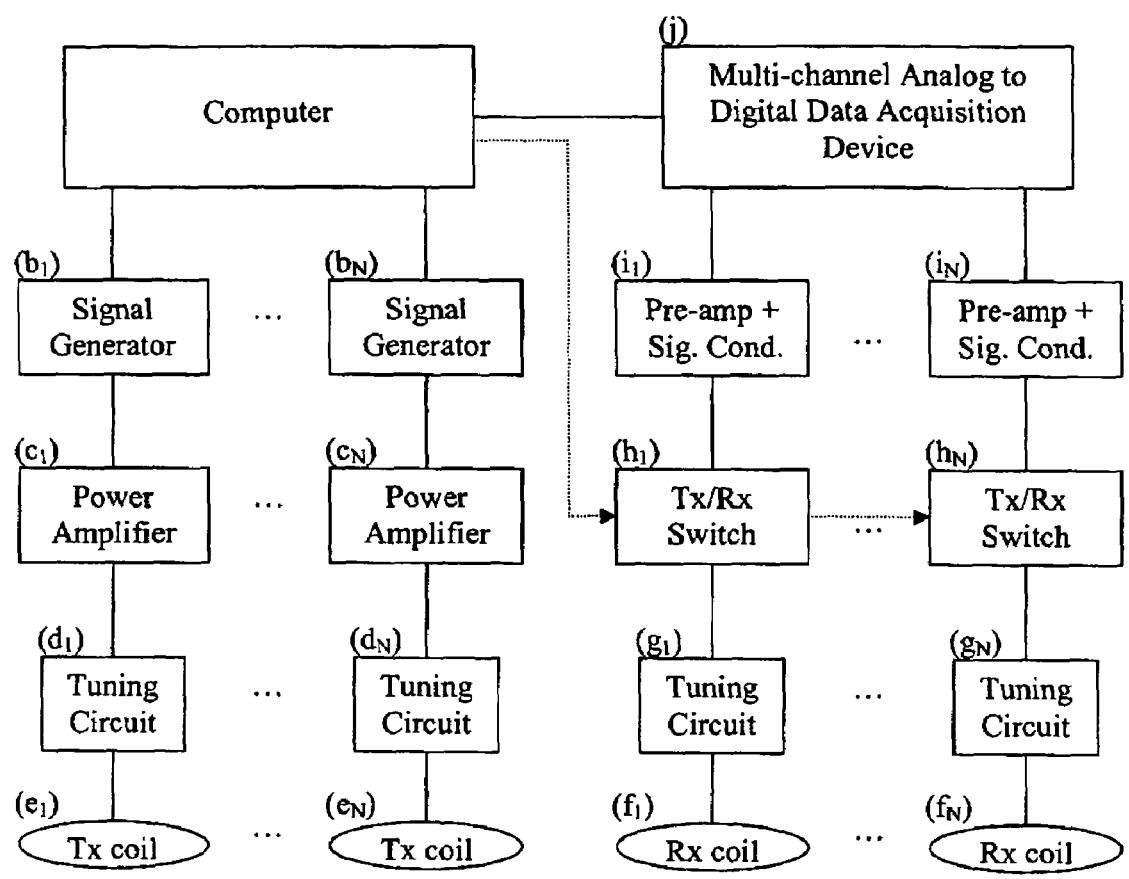
FIG. 1 is a block diagram of a multi-channel NMR data acquisition apparatus that uses separate coils for transmit and receive functions.

Detailed Description of a Single Data Acquisition Method:

Turning now descriptively to the drawings, FIG. 1 illustrates a functional apparatus for acquiring multicoil NMR data according to an embodiment of the present invention, which comprises a method for acquiring surface NMR data using an array of at least two transmit and receive coils and a method for processing such multicoil data to estimate the three-dimensional NMR spin density distribution within the object or volume under investigation.

FIG. 1 depicts the generic hardware systems and processes involved in the multicoil data acquisition procedure. The data acquisition process is controlled by computer (a). The computer (a) in concert with signal generator(s) ($b_1$-$b_N$), produces a transient waveform(s), or pulse(s), on the selected transmit coils(s). The waveform for each transmit pulse(s) is amplified to the desired level by a power amplifier(s) ($c_1$-$c_N$). The amplified current pulse(s) drives a tuning circuit(s) ($d_1$-$d_N$) and transmit coil(s) ($e_1$-$e_N$). The amplified current in the transmit coil(s) produces the B1 field, and the B1 field causes the nuclear magnetic moments of susceptible molecules to precess about the B0 field in phase with the B1 field. During the application of the transmit pulse(s), the receive Tx/Rx switches ($h_1$-$h_N$) are left open to prevent damage to sensitive electronic components in the receive chain. The receive tuning circuits ($g_1$-$g_N$) may be set to a low-Q state during and/or slightly after the application of the transmit pulse, to rapidly dissipate transient currents in the receive coils caused by the large amplitude B1 fields.

After the termination of the transmit pulse(s), and a short additional time delay to allow transient currents to decay, the Tx/Rx switches ($h_1$-$h_N$) are closed and signal acquisition is initiated. If the tuning circuits ($g_1$-$g_N$) were set to a low-Q state during the transmit operation, they may be retuned to a high-Q to optimize reception of the weak narrowband NMR signal during receive mode. The precessing magnetic moments generate alternating magnetic fields, which in turn generate currents on the receive coils ($f_1$-$f_N$). The received current sources are routed through the tuning circuits ($g_1$-$g_N$) and Tx/Rx switches ($h_1$-$h_N$) and amplified by pre-amplifiers ($i_1$-$i_N$) and filtered by signal conditioning circuits ($i_1$-$i_N$). The amplified and conditioned analog voltages or currents are sampled and converted to digital signals by a multi-channel analog to digital (A/D) data acquisition device (j). The A/D device (a) is controlled by the computer (a). Digital signals from the A/D device (j) are transferred to the computer (a) for storage. Signals are recorded for a finite length of time, depending on the decay rate for the NMR signal and operational objectives.

The multicoil NMR data acquisition experiment is repeated using a sufficient number of different transmit array combinations and transmitted energy levels to achieve the desired spatial resolution.

Embodiments and Variations of the Multicoil NMR Data Acquisition Method:

A first embodiment of the multicoil data acquisition method is to transmit on only one transmit coil for each single NMR measurement. A series of such measurements are acquired using different transmit coils, and using at least two different transmit energy levels for each selected transmit coil.

A second embodiment of the multicoil NMR data acquisition method is to transmit simultaneously on all of the transmit coils, but to use at least two linearly independent transmit array combinations, and at least two different total transmitted energy levels for each transmit array combination.

Figure 2:
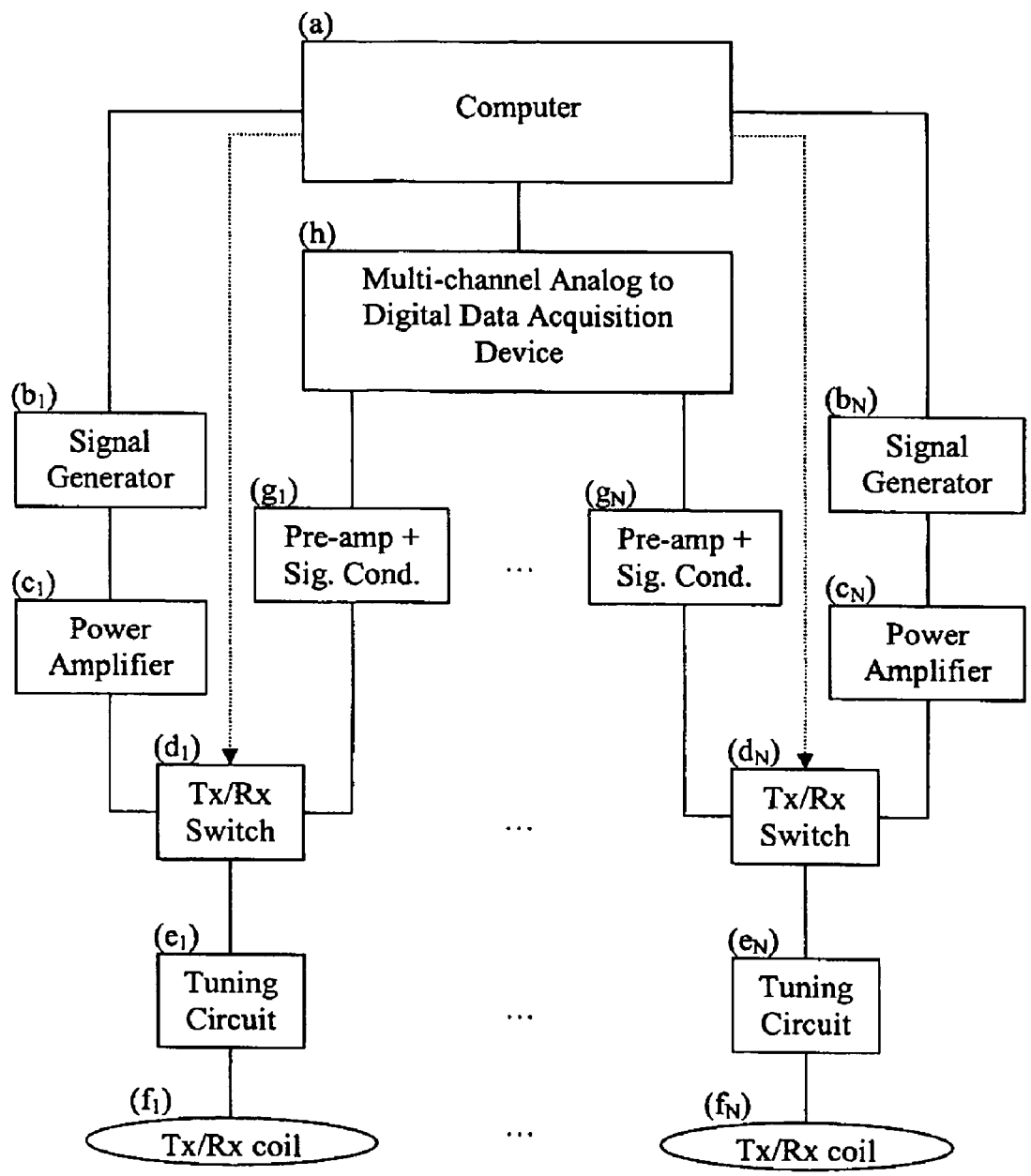
FIG. 2 is a block diagram of a multi-channel NMR data acquisition apparatus that uses the same array of coils for transmit and receive functions.

A preferred embodiment of the multicoil NMR data acquisition method uses the same array of coils for both the transmit function and the receive function. Turning then to FIG. 2, a switching circuit ($d_1$-$d_N$) is located at or near the drive point of each coil. In this embodiment, the switching circuits ($d_1$-$d_N$) isolate the sensitive receive electronics during the application of the high-energy transmit pulse(s). The tuning circuits ($e_1$-$e_N$) may be switched to a low-Q state during the short period between the end of the transmit pulse and the onset of data recording, to allow transient coil currents to dissipate.

Another embodiment of the multicoil NMR data acquisition method utilizes a reduced number of transmit and/or receive coils, and utilizes repeated measurements physically displacing the coils between measurements, in order to synthesize a larger transmit and/or receive array. This embodiment might be preferred in applications where the savings in cost and complexity for the acquisition hardware outweighs the additional time that it might take to collect the required measurements in synthetic aperture mode. Another potential benefit of synthetic aperture processing is reduction or elimination of mutual coupling between the receive coils, especially if the embodiment uses a single receive coil.

A preferred embodiment of the multicoil NMR data acquisition method is to utilize single or multiple-turn wire loops as the transmit coils and/or receive coils. However, those persons skilled in the art will appreciate that any transmit device capable of generating an alternating magnetic field, and any receive device capable of measuring an alternating magnetic field can be employed. Thus, alternative transmit devices include any viable means for creating a magnetic field, such as current carrying loops, coils (whether open core or filled core, e.g., iron), long lines, etc. Alternative receive devices include loops, coils or other similar apparatus capable of transmitting induced electrical currents, magnetometers, e.g., flux gate, magneto-resistive, etc., interference devices such as superconducting quantum interference apparatus.

A preferred embodiment of the multicoil NMR data acquisition method is to transmit a single continuous pulse, and then record the resulting free induction decay (FID) signals on the receive coils. The multicoil NMR data acquisition method may also be embodied by transmitting a series of plural pulses to produce spin-echo signals on the receive coils. Those persons skilled in the art will appreciate that embodiments of the invention are not limited to any particular transmitted waveform, or to any particular series of transmitted waveforms; multicoil NMR data acquisition methods according to the invention may use any combination of transmitted waveforms that will produce a useable NMR signal on the receive coil(s).

Noise Cancellation Method

The noise cancellation method embodiment comprises specific methods for processing surface NMR data acquired via the multicoil surface NMR data acquisition arrangement: a noise cancellation data acquisition method which utilizes one or more reference measurements to estimate the unwanted noise process; a noise cancellation data processing method which adaptively estimates and subtracts the noise process from surface NMR data.

The general description of the noise cancellation method is:

(1) Utilize an auxiliary electrical, magnetic, or electromagnetic device or devices to measure noise process(es) in the vicinity of the multicoil surface NMR data acquisition experiment.

(2) Construct a linear combination of the auxiliary noise measurement samples that estimates the noise process(es) as measured on one or more multicoil surface NMR data samples, and subtract said estimate of the noise process from one or more multicoil NMR data samples.

Detailed Description of the Noise Cancellation Method:

The noise cancellation data acquisition method is as follows:

1. Employ one or more auxiliary electrical, magnetic, or electromagnetic measurement devices in a physical arrangement that is favorable to the detection of the noise process or processes that could potentially degrade the multicoil surface NMR measurement data.

2. Acquire data using the auxiliary electrical, magnetic, or electromagnetic measurement devices during the entire time frame that the multicoil surface NMR data are acquired, or during a portion of the time frame that the multicoil surface NMR data are acquired.

The noise cancellation data processing method is as follows:

1. Construct a set of noise reference data samples $\{n(1), \ldots, n(N)\}$ from the auxiliary data acquired using the noise cancellation data acquisition method. The noise reference data samples $\{n(1), \ldots, n(N)\}$ may be samples taken directly from the auxiliary data acquired using the noise cancellation data acquisition method, or any linear combination of samples from the auxiliary data acquired using the noise cancellation data acquisition method.

2. Construct a linearly transformed surface NMR data sample X from the data acquired using the multicoil surface NMR data acquisition procedure. The transformed surface NMR data sample X may be any single data sample or any linear combination of data samples acquired using the multicoil surface NMR data acquisition procedure.

3. Compute a set of linear coefficients $\{\alpha(1), \ldots, \alpha(N)\}$ for computing an estimate of the noise process P on each surface NMR data sample via a linear combination of the noise reference data samples $\{n(1), \ldots, n(N)\}$:

$Q=\alpha(1)n(1)+\ldots+\alpha(N)n(N)$

4. Subtract the estimated noise sample Q from the linearly transformed surface NMR data sample X:

$Y=X-Q.$

Embodiments and Variations of the Noise Cancellation Method:

A first embodiment of the multicoil noise cancellation method uses one or more auxiliary surface coils to measure noise processes in the vicinity of the multicoil surface NMR data acquisition experiment.

A second embodiment of the noise cancellation method uses correlation cancellation as the mathematical basis for estimating the linear coefficients $\{\alpha(1), \ldots, \alpha(N)\}$. Correlation cancellation is well known to those versed in the arts of signal processing methods, and produces a set of coefficients $\{\alpha(1), \ldots, \alpha(N)\}$ that minimizes the mean squared value of the residual Y. There are a large number of direct, block-based, and iterative mathematical algorithms for estimating the linear coefficients $\{\alpha(1), \ldots, \alpha(N)\}$ and minimizing the mean squared value of the residual Y. Several implementations of such correlation cancellation algorithms are described by S. Haykin in "Adaptive Filter Theory" Prentice Hall, Upper Saddle River, N.J., 1996, and incorporated hereinto by reference.

A preferred embodiment of the noise cancellation method constructs the NMR data sample X as a sample of the discrete Fourier transform of a raw surface NMR measurement sequence from a single surface coil. A modification of this embodiment also constructs noise reference data samples $\{n(1), \ldots, n(N)\}$ as samples of the discrete Fourier transform(s) of the raw data sequence(s) measured via the auxiliary electrical, magnetic, or electromagnetic measurement device(s).

Image Processing Method

The present invention specifies three different methods for mathematically processing the multicoil NMR data, acquired according to the multicoil NMR data acquisition method, to isolate the NMR signals arising from different regions of the three-dimensional volume of investigation. The first method is an application of the principle of matched filtering (correlation) for multicoil NMR imaging. The second method is an application of adaptive filtering for multicoil NMR imaging. The third method is the application of linear inverse/least squares solution techniques for multicoil NMR imaging.

In all three data processing methods, the data consists of a set of L×M×P sampled NMR signals, where L is the number of different transmit array combinations, M is the number of receive coils, and P is the number of different total energy levels transmitted for each transmit array combination. If each NMR signal consists of K time-domain data samples, then the entire data set consists of K×L×M×P data samples.

Detailed Description of the Matched Filtering Data Processing Method:

The generic method of mathematical correlation is familiar to those skilled in the arts of math and science. The embodiment described in the following paragraphs includes a specific formulation of the correlation method for estimating the three-dimensional NMR spin density distribution, given a set of NMR data acquired using the multicoil NMR data acquisition method.

The relative NMR spin density is estimated on a point-by-point basis, throughout the three-dimensional volume of interest. The volume may be sampled uniformly or non-uniformly, depending on the requirements of the application. For each hypothetical sample location (a location in the volume of interest), the relative NMR spin density is estimated as follows:

1. Compute the hypothetical initial amplitudes and phases, for the entire set of L×M×P sampled NMR signals, that would occur if a standardized unit volume of NMR spin density centered at the hypothetical sample location was subjected to the same multicoil NMR data acquisition procedure that is used to generate the data. For a single sampled NMR signal, this is accomplished by the following procedure, which will be understood by those who are skilled in the art of NMR processes and antenna field theory:

ii) Compute the phase of the precessing magnetic moment at the hypothetical sample location, relative to a fixed reference phase. The phase of the precessing magnetic moment is determined by the orientation of the transverse component of the transmitted B1 field at the hypothetical sample location. (In this discussion, the transverse component of any field is the component of the field that is perpendicular to the static field B0.)

iii) Compute the phase of the received NMR signal due to the assumed precessing magnetic moment at the hypothetical sample location. The phase of the received NMR signal is determined by the orientation of the transverse component of the receive coil at the hypothetical sample location, the phase of the precessing magnetic moment, and the fixed phase reference.

iv) Compute the tip angle of the precessing magnetic moment at the hypothetical sample location. The tip angle is determined by the total energy contained in the transverse field component of the transmitted pulse, at the hypothetical sample location. For a single transmit pulse, the tip angle is generally a linear function of the energy contained in the transverse component of the field at the sample location. If multiple transmit pulses are used, the tip angle depends on the entire pulse train.

v) Compute the initial amplitude of the received NMR signal. The initial amplitude of the received NMR signal depends on the magnitude of the transverse component of the receive coil field at the hypothetical sample location, as well as the tip angle of the precessing magnetic moment. The initial amplitude of the received NMR signal is a sinusoidal function of the tip angle, with maxima at +90 degrees and −90 degrees, and minima at 0 degrees and +180 degrees.

vi) The entire set of L×M×P initial received amplitude and phase values may be arranged as a L×M×P vector of complex numbers, where each complex number represents the hypothetical initial amplitude and phase of one of the NMR signals for the hypothetical sample location. This vector represents a filter vector that is matched to the expected set of initial amplitudes and phases for a unit volume of NMR spin density at the hypothetical sample location. This matched filter vector is referred to as $h_{(x,y,z)}$ where the subscript (x,y,z) denotes the hypothetical sample location in Cartesian coordinate space.

2. Compute the 2-norm $\|h_{(x,y,z)}\|$ of the matched filter vector $h_{(x,y,z)}$.

3. Normalize the matched filter vector $h_{(x,y,z)}$ to unit energy by dividing it, sample-by-sample, by its 2-norm:

$h_{n(x,y,z)} = h_{(x,y,z)} / \|h_{(x,y,z)}\|$.

4. Multiply each of the measured NMR signals by the associated initial amplitude sample from the normalized matched filter vector $h_{n(x,y,z)}$.

5. Apply a constant phase shift to each of the measured NMR signals equal to the negative of the associated phase sample from the normalized matched filter vector $h_{n(x,y,z)}$.

6. Coherently sum, on a time sample-by-sample basis, all of the amplitude-adjusted phase-shifted versions of the measured NMR signals. The resulting composite sampled NMR signal $s_{(x,y,z)}$ is the estimated NMR signal for the hypothetical sample location (x,y,z).

7. The relative NMR spin density at the location (x,y,z) is estimated as the initial value of $s_{(x,y,z)}$ divided by $\|h_{(x,y,z)}\|$.

Features of this technique are the construction of the matched filter $h_{(x,y,z)}$ and its application to isolate the NMR signal $s_{(x,y,z)}$ arising from a given location (x,y,z) within the volume. Other relevant sample properties, such as the decay constant at location (x,y,z), can be estimated from the composite NMR signal $s_{(x,y,z)}$ using existing signal processing methods, which are familiar to those skilled in the art of NMR.

Embodiments Using the Matched Filtering Data Processing Method:

In a preferred embodiment using the matched filtering data processing method, the phase shift is implemented by applying a time shift to each measured NMR signal such that the signal phase at the Larmor frequency is shifted by the specified amount. In another variation, the time shift is accomplished in the Fourier domain by computing the discrete Fourier transform of the measured NMR signal, then applying a linear phase shift in the Fourier domain, and then computing the inverse Fourier transform to produce the time-shifted version of the measured NMR signal.

In another preferred embodiment using the matched filtering data processing method, the measured NMR signals are de-modulated by multiplication with the sampled exponential function $e^{(-j2\pi f n T)}$, where f is the Larmor frequency. In this embodiment, the measured NMR signals are transformed to complex valued sequences centered approximately at DC. In this variation, the phase shift of the matched filter is applied directly to each complex NMR signal by multiplying each time-domain sample by $e^{(j\phi)}$ or $e^{(-j\phi)}$, where $\phi$ is phase of a matched filter for that particular NMR signal.

In yet another embodiment using the matched filtering data processing method, each measured NMR signal is initially reduced to a single complex number by multiplying it by the sampled exponential function $e^{(-j2\pi f n T)}$ and coherently summing the series of samples (or equivalently, computing the discrete Fourier transform of the series and selecting the DFT sample at the Larmor frequency). This complex number is an estimate of the amplitude and phase of the NMR signal content at the Larmor frequency. In this embodiment, the matched filter phase shift is applied by multiplying the single complex number representing each measured NMR signal by $e^{(j\phi)}$ or $e^{(-j\phi)}$, where $\phi$ is phase of a matched filter for that particular NMR signal.

In still another embodiment using the matched filtering data processing method, the discrete sine transform is used to execute the portion of the matched filtering relating to the sinusoidally-dependent NMR tip angle response.

Detailed Description of the Adaptive Filtering Data Processing Method:

The generic method of adaptive filtering is familiar to those persons skilled in the art of math and signal processing. Embodiments of the invention use a specific formulation of the adaptive filtering method for estimating the three-dimensional NMR spin density distribution, given a set of NMR data acquired using the multicoil NMR data acquisition method.

The relative NMR spin density is estimated on a point-by-point basis, throughout the three-dimensional volume of interest. The volume may be sampled uniformly or non-uniformly, depending on the requirements of the application. For each hypothetical sample location (a location in the volume of interest), the relative NMR spin density is estimated as follows:

1. Arrange the entire set of measured NMR data as a matrix B with K columns and L×M×P rows. Each row is one measured, sampled NMR signal, corresponding to one particular combination of transmit array combination, receive coil(s) and transmit energy. The column indices correspond to time samples.
2. Compute the data correlation matrix for the measured data matrix:

$R_{BB} = BB^H$ where the superscript $^H$ denotes conjugate transpose.
3. If the correlation matrix $R_{BB}$ is less than full rank, pre-process $R_{BB}$ so that it becomes invertible (full rank). One method for making $R_{BB}$ invertible is to average the all the matrix elements along each diagonal.
4. Compute the inverse $R_{BB}^{-1}$ of the full-rank data correlation matrix $R_{BB}$.
5. For each hypothetical sample location (x,y,z), compute the normalized matched filter vector $h_{n(x,y,z)}$ as previously described in the detailed description for the matched filtering method (1. i-v).
6. Compute the adaptive filter $m_{(x,y,z)}$ as $m_{(x,y,z)} = h_{n(x,y,z)} R_{BB}^{-1} / (h_{n(x,y,z)} R_{BB}^{-1} h_{n(x,y,z)}^H)^{1/2}$.

7. Multiply each of the measured NMR signals by the associated initial amplitude sample from the adaptive filter vector $m_{(x,y,z)}$.
8. Apply a constant phase shift to each of the measured NMR signals equal to the negative of the associated phase sample from the adaptive filter vector $m_{(x,y,z)}$.
9. Coherently sum, on a time sample-by-sample basis, all of the amplitude-adjusted phase-shifted versions of the measured NMR signals. The resulting composite sampled NMR signal $s_{(x,y,z)}$ is the estimated NMR signal for the hypothetical sample location (x,y,z).

Features of this technique are the construction of the adaptive filter $m_{(x,y,z)}$, and its application to isolate the NMR signal $s_{(x,y,z)}$ arising from a given location (x,y,z) within the volume.

Other relevant sample properties, such as the decay constant at location (x,y,z), can be estimated from the composite NMR signal $s_{(x,y,z)}$ using existing signal processing methods, which are familiar to those skilled in the art of NMR.

The difference between the normalized matched filter $h_{n(x,y,z)}$ and the adaptive filter $m_{(x,y,z)}$ is that the matched filter is optimized for detecting the NMR signal emanating from location (x,y,z) in a background of random white noise, while the adaptive filter is optimized for isolating the NMR signal emanating from location (x,y,z) when the interference signal exhibits a correlated structure in the measured data.

Embodiments Using the Adaptive Filtering Data Processing Method:

In a preferred embodiment using the adaptive filtering data processing method, the phase shift is implemented by applying a time shift to each measured NMR signal such that the signal phase at the Larmor frequency is shifted by the specified amount. In another variation, the time shift is accomplished in the Fourier domain by computing the discrete Fourier transform of the measured NMR signal, then applying a linear phase shift in the Fourier domain, and then computing the inverse Fourier transform to produce the time-shifted version of the measured NMR signal.

In another preferred embodiment using the adaptive filtering data processing method, the measured NMR signals are de-modulated by multiplication with the sampled exponential function $e^{(-j2\pi f nT)}$, where f is the Larmor frequency. In this embodiment, the measured NMR signals are transformed to complex valued sequences centered approximately at DC. In this variation, the phase shift of the adaptive filter is applied directly to each complex NMR signal by multiplying each time-domain sample by $e^{(j\phi)}$ or $e^{(-j\phi)}$, where $\phi$ is phase of adaptive filter for that particular NMR signal.

In yet another embodiment using the adaptive filtering data processing method, each measured NMR signal is initially reduced to a single complex number by multiplying it by the sampled exponential function $e^{(-j2\pi f nT)}$ and coherently summing the series of samples (or equivalently, computing the discrete Fourier transform of the series and selecting the DFT sample at the Larmor frequency). This complex number is an estimate of amplitude and phase of the NMR signal content at the Larmor frequency. In this embodiment, any time-domain envelope information, such as the exponential decay rate, is lost. In this embodiment, the adaptive filter phase shift is applied by multiplying the single complex number representing each measured NMR signal by $e^{(j\phi)}$ or $e^{(-j\phi)}$, where $\phi$ is phase of adaptive filter for that particular NMR signal.

Detailed Description of the Linear Inverse/Least-Squares Data Processing Method:

The generic method of computing a solution to a set of linear equations is familiar to those persons skilled in the art of math and science. Embodiments of the invention employ a specific formulation of the linear inverse/least squares solution technique for estimating the three-dimensional NMR spin density distribution, given a set of NMR data acquired using the multi-channel data acquisition method.

The linear inverse/least-squares data processing method for estimating the 3-D NMR spin density from a set of multi-channel NMR data is implemented as follows:
1. Select a set discrete volume elements (voxels) that encompass the 3-D volume or object of interest. The voxel sizes and shapes may be uniform (i.e. cubes of fixed dimension), variable, or arbitrary.
2. Develop a set of linear equations Ax=b relating the unknown sampled NMR signal arising from the spin density within each voxel, to each sample in the measured data set. This may be accomplished as follows:

a. Model the sampled NMR signal source in each voxel as a set of time-domain samples. The NMR signal source in each voxel has an unknown initial amplitude that is dependent on the volume contained by the voxel and the NMR spin density within the voxel. The NMR signal source also has an unknown initial phase and unknown time-domain modulation. The phase and time domain modulation (including decay rates) are characteristic properties the material within each voxel.

b. Compute the coefficients for the set of linear equations relating the unknown NMR signal source samples for each voxel to the measured data samples. These coefficients depend on the amplitudes and phases of the transverse magnetic fields of the receive coils at each voxel, and the sequence of applied transverse B1 pulse energies at each voxel. The linear transform coefficients can be calculated using the description for the matched filtering method (1. i-v), along with a model for the absolute initial amplitude of the received signal based on the dimension of each voxel.

c. Organize the system of linear equations as a matrix equation:

$$Ax=b$$

where x is the vector of unknown NMR signal source samples (N time-domain samples for each voxel), b is the vector of measured NMR data samples, and A is the matrix of coefficients relating the unknown voxel-specific time-domain samples x to the measured NMR data samples b.

3. Compute the least squares solution to Ax=b, or a regularized version of the least squares solution to Ax=b. There are many possible methods for computing the least squares solution or a regularized least squares solution to a set of linear equations. Thus, any mathematical algorithm that computes an estimate of the least squares solution or regularized least squares solution to the set of linear equations Ax=b is considered an appropriate means for solving the equation. Specific embodiments are described hereinafter.

Embodiments Using the Linear Inverse/Least-Squares Data Processing Method:

In a preferred embodiment using the linear inverse/least-squares data processing method, the least squares solution x is computed directly using via the least squares pseudo-inverse:

$$x=(A^HA)^{-1}A^Hb$$

where the superscript $^H$ indicates conjugate transpose. In a preferred variation of this embodiment, the least squares solution is regularized by adding a constant scalar value to the diagonal elements of A or $A^HA$, prior to computing the inverse of $(A^HA)$.

In another preferred embodiment using the linear inverse/least-squares data processing method, the least squares solution is computed by first computing the singular value decomposition of A as $$A=USV^H,$$

where the columns of V are an orthonormal set of basis vectors for $A^HA$ and the elements $w_j$ of the diagonal matrix S contains the positive square roots of the eigenvalues of $A^HA$, and then computing the least squares solution as:

$$x=V[\text{diag}(1/w_j)]U^Hb.$$

In a preferred variation of this embodiment, the least squares solution is regularized by weighting the orthogonal solution components such that the solution components generated from columns V with large associated singular values ($w_j$) are emphasized more than the solution components generated from columns of V with small associated singular values.

In yet another preferred embodiment using the linear inverse/least-squares data processing method, the least squares solution is computed using a linear iterative algorithm. Such linear iterative solution techniques include, but are not limited to: the Gradient Descent algorithm, the Steepest Descent algorithm, and the Conjugate Gradient algorithm. In a preferred variation of this embodiment, the least squares solution is regularized by terminating the iteration prior to its final convergence to the least squares solution.

In still another embodiment using the linear inverse/least-squares data processing method, each measured NMR signal is initially reduced to a single complex number by multiplying it by the sampled exponential function $e^{(-j2\pi f_n T)}$ and coherently summing the series of samples (or equivalently, computing the discrete Fourier transform of the series and selecting the DFT sample at the Larmor frequency). This complex number is an estimate of the amplitude and phase of the NMR signal content at the Larmor frequency. In this embodiment, any time-domain envelope information, such as the exponential decay rate, is lost. In this embodiment, the solution x consists of complex samples, where each sample represents the amplitude and phase of the NMR signal source for a given voxel.

Operation of a Robust Embodiment

While the invention comprises at least some of the previously described features in various combinations, a better understanding of the invention can be ascertained by reviewing the field implementation of many of these features. Thus, the general procedure for acquiring and processing NMR data using this invention consists of: (1) hardware set-up, (2) data acquisition, (3) data processing.

1) Hardware set-up preferably comprises arranging the transmit coils and receive coils in a pattern near or around the object or volume of interest, and arranging the other acquisition hardware so as not to interfere with the data collection procedure. The coils may be arranged to maximize coverage of the object or volume of interest, and/or to maximize the diversity of coil field patterns incident across the object or volume of interest. Furthermore, the coil arrays may be arranged to minimize mutual coupling between coils. In addition, the layout of the coil arrays may be accomplished with the aid of numerical modeling software to optimize the resulting image quality for each application. Other acquisition devices should be arranged so as not to produce undue electrical or magnetic interference that would degrade the quality of the recorded NMR data.

2) Data acquisition preferably comprises transmitting specified magnetic pulse trains at the Larmor frequency, using at least two transmit coils, and recording the subsequent NMR signals from at least two receive coils. Data are recorded, digitized and stored on appropriate media as the data acquisition progresses.

3) Data processing preferably comprises executing computer software that retrieves the stored NMR data and processes it using one of the three data processing methods described herein so as to estimate the NMR spin density distribution and other material properties within the three-dimensional volume. Data processing may be performed entirely after all the NMR data for a given investigation have been acquired and stored. Alternately, data processing may be performed intermittently, in parallel with the data acquisition procedure, as partial NMR data becomes available.

With respect to the above description then, it is to be realized that the optimum dimensional relationships for the parts of the invention, to include variations in size, materials, shape, form, function and manner of operation, assembly and use, are deemed design and optimization considerations readily apparent and obvious to a person skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed:

1. A method of obtaining a localized nuclear magnetic resonance signal from a sample in a static magnetic field using an array of two or more magnetic field transmitting coils, and an array of two or more magnetic field receiving coils, comprising:
   a) generating a single alternating current excitation pulse on one or more transmitting coils, each of said transmitting coils providing a spatially distinct inhomogeneous field;
   b) acquiring NMR signals on two or more magnetic field receiving coils;
   c) applying a plurality of excitation pulses to each transmitting coil or combination of transmitting coils, wherein each excitation pulse has a unique pulse moment defined as the product of the pulse amplitude and pulse length, and wherein the nth pulse moment $PM(n)$ is not equal to $(2n-1)*PM(1)$; and
   d) constructing a localized nuclear magnetic resonance signal as a linear combination of NMR signals obtained using two or more transmitting coils or combinations of transmitting coils, two or more receiving coils, and two or more pulse moments for each transmitting coil.

2. The method according to claim 1, wherein the localized NMR signal is obtained using a matched filtering data processing method comprising:
   a) computing the expected tip angle and phase of a precessing unit-valued magnetic moment at the sample location, for each applied combination of magnetic field transmitting coils and pulse moments;
   b) computing the expected amplitude and phase of each forward-modeled NMR signal, each forward-modeled signal resulting from the modeled detection of the precessing unit-valued magnetic moment at the hypothetical sample location by each of magnetic field receiving coils, and representing said expected amplitude and phase as a complex scalar;
   c) arranging the set of said complex scalar values as a vector matched filter vector h, wherein each complex scalar represents the expected amplitude and phase of the signal response for a unit valued magnetic moment at the sample location for a given combination of transmit coil or coils, receive coil, and pulse moment;
   d) computing a conjugate matched filter vector h* formed as a complex conjugate value of h; and
   e) computing the localized NMR signal s as the linear combination of the recorded NMR signals wherein each recorded signal $b_j$ is weighted by its respective conjugate matched filter vector coefficient $h_j^*$: $s=\Sigma_j h_j^* b_j$.

3. The method according to claim 2, wherein the localized NMR signal is obtained using an adaptive filtering data processing method comprising:
   a) computing a matched filter vector h according to claim 2;
   b) arranging the set of recorded nuclear magnetic resonance data as a matrix B with M×L×P rows, wherein each row is the sampled nuclear magnetic resonance signal recorded at one magnetic field receiving coil for one combination of transmitting coils and pulse moment;
   c) computing a data correlation matrix $R_{BB}=BB^H$ where the superscript H denotes conjugate transpose;
   d) computing the inverse $R_{BB}^{-1}$ of the full-rank data correlation matrix $R_{BB}$;
   e) computing the adaptive filter vector $m=h R_{BB}^{-1}/(h R^{BB-1} h^H)^{1/2}$;
   f) computing a conjugate adaptive filter vector m* formed as a complex conjugate value of m; and
   g) computing the localized NMR signal s as the linear combination of the recorded NMR signals wherein each recorded signal $b_j$ is weighted by its respective conjugate adaptive filter vector coefficient $m_j^*$: $s=\Sigma_j m_j^* b_j$.

4. The method according to claim 3, wherein the elements of the matched filter vector h are equal to a fixed constant scalar value for NMR data recorded on one receive coil only, and wherein the elements of the matched filter vector h are zero for NMR data recorded on all other receive coils.

5. The method according to claim 1, wherein the localized NMR signal is obtained using a linear inverse/least-squares data processing method comprising:
   a) selecting a set of discrete volume elements (voxels) that encompass the 2-D or 3-D volume or object of interest; and
   b) developing a set of linear equations Ax=b relating the sampled signal arising from the unknown spin density within each individual voxel to each sample in the experimentally recorded data set comprising:
      1) arranging the entire set of recorded nuclear magnetic resonance data samples as a vector b;
      2) arranging the set of unknown voxel spin density values as a vector x;
      3) computing each coefficient of the matrix A as a complex value describing the amplitude and phase of the recorded NMR signal that would result from the detection of a collection of precessing nuclear magnetic resonance spins, of unit spin density, contained within the hypothetical voxel corresponding to an unknown sample of x, using one particular combination of transmit coil or coils, receive coil, and pulse moment;
      4) calculating the set of localized NMR signals x as the least squares solution to the system of linear equations Ax=b, or as a regularized least squares solution to Ax=b, using any mathematical algorithm that computes an estimate of the least squares solution or regularized least squares solution to the set of linear equations Ax=b.

6. The method according to claim 5, wherein the inverse or pseudo-inverse of the matrix A is computed once, and is applied sequentially to discrete time samples to obtain localized NMR signals on a time-sample-by-sample basis.

7. The method according to claim 5, wherein the least squares solution is calculated by one of the direct pseudo-inverse $x=(A^H A)^{-1} A^H b$, or by the regularized direct pseudo-inverse, where small scalar values are added to the diagonal elements of A or $A^H A$, prior to computing the inverse of $(A^H A)$.

8. The method according to claim 5, wherein the least squares solution or regularized least squares solution is calculated by a singular value decomposition method comprising:
   a) calculating the singular value decomposition of the matrix $A=USV^H$; and
   b) one of calculating the least squares solution as $x=V[\text{diag}(1/\sigma_j)]U_H b$, or calculating a weighted least squares solution, where the diagonal terms $\text{diag}(1/\sigma_j)$ are each multiplied by a weighting factor prior to performing the matrix multiplication.

9. The method according to claim 5, wherein the least squares solution or regularized least squares solution is calculated using a linear iterative least squares solution algorithm comprising:
   a) the gradient descent algorithm;
   b) the steepest descent algorithm; or the conjugate-gradient algorithm.

10. The method according to claim 1 wherein at least some the nuclear magnetic resonance signals result from the presence of groundwater.

11. The method according to claim 1 wherein the static magnetic field is the Earth's magnetic field.

12. The method according to claim 1, wherein each recorded nuclear magnetic resonance signal is initially reduced to a single complex number by multiplying each data sample by the sampled exponential function $e^{(-j2\pi f_n T)}$ or the sampled exponential function $e^{(-j2\pi f_n T)}$ and coherently summing the resulting series of samples.

13. The method according to claim 1 wherein at least one of the transmitting magnetic field coils and receiving magnetic field coils is the same, and this coil is used for the purposes of both transmitting and receiving.

14. The method according to claim 1 wherein a reduced number of transmitting magnetic field coils and/or receiving magnetic field coils are physically displaced and additional nuclear magnetic resonance signals are recorded via the displaced coils, so as to generate a set of data equivalent to that obtained using a full set of transmitting and receiving magnetic field coils.

15. The method according to claim 1, wherein each recorded nuclear magnetic resonance sample is a single sample of the discrete Fourier transform (DFT) of the sampled nuclear magnetic resonance signal.

16. The method according to claim 1, wherein an image is computed over a 3-dimensional field of view.

17. The method according to claim 1, wherein an image is computed over a 2-dimensional field of view.

18. The method according to claim 1, wherein an image is computed over a 1-dimensional field of view.

* * * * *